United States Patent [19]

Blakeney et al.

[11] Patent Number: 5,164,286
[45] Date of Patent: Nov. 17, 1992

[54] PHOTORESIST DEVELOPER CONTAINING FLUORINATED AMPHOTERIC SURFACTANT

[75] Inventors: Andrew J. Blakeney, Seekonk; Robert Rogler, Rehoboth, both of Mass.; Medhat Toukhy, Barrington; David Brzozowy, Lincoln, both of R.I.

[73] Assignee: OCG Microelectronic Materials, Inc., Cheshire, Conn.

[21] Appl. No.: 825,240

[22] Filed: Jan. 24, 1992

Related U.S. Application Data

[63] Continuation-in-part of Ser. No. 649,106, Feb. 1, 1991, abandoned.

[51] Int. Cl.$^5$ .......................... G03E 7/32; G03C 5/00
[52] U.S. Cl. .................................... 430/331; 430/325; 430/326
[58] Field of Search ............... 430/331, 326, 309, 493, 430/464, 325; 252/DIG. 7, 547, 541, 548, 356, 174.14, DIG. 8, 546; 134/48

[56] References Cited

U.S. PATENT DOCUMENTS

| | | | |
|---|---|---|---|
| 3,891,439 | 6/1975 | Katz et al. | |
| 3,993,799 | 11/1976 | Feldstein | 430/324 |
| 4,089,804 | 5/1978 | Falk | 252/356 |
| 4,464,461 | 8/1984 | Guild | 430/326 |
| 4,610,953 | 9/1986 | Hashimoto et al. | 430/331 |
| 4,613,561 | 9/1986 | Lewis | 430/326 |
| 4,628,023 | 12/1986 | Cawston et al. | 430/331 |
| 4,661,436 | 4/1987 | Lewis et al. | 430/326 |
| 4,710,449 | 12/1987 | Lewis et al. | 430/326 |
| 4,741,989 | 5/1988 | Niwa et al. | 430/331 |
| 4,784,937 | 11/1988 | Tanaka et al. | 430/331 |
| 4,806,453 | 2/1989 | Vidusek et al. | 430/312 |
| 4,820,621 | 4/1989 | Tanka et al. | 430/331 |
| 4,847,004 | 7/1989 | McLeod | 252/527 |
| 4,880,724 | 11/1989 | Toyama et al. | 430/331 |
| 4,914,006 | 4/1990 | Kato et al. | 430/331 |
| 4,997,748 | 3/1991 | Takeda et al. | 430/326 |

FOREIGN PATENT DOCUMENTS 55-66909  5/1980  Japan .
64-072155  3/1989  Japan .................. 430/331

Primary Examiner—Marion E. McCamish
Assistant Examiner—Janis L. Dote
Attorney, Agent, or Firm—William A. Simons

[57] ABSTRACT

Described herein is a developer for alkali developable photoresists which comprises the addition of a selected fluorinated amphoteric surfactant to an aqueous basic solution.

12 Claims, No Drawings

PHOTORESIST DEVELOPER CONTAINING FLUORINATED AMPHOTERIC SURFACTANT

CROSS-REFERENCE TO RELATED APPLICATION

This application is a Continua tion-In-Part application of U.S. patent application Ser. No. 649,106, filed on Feb. 1, 1991, now abandoned Blakeney, Robert Rogler, Medhat Toukhy, and David Brzozowy as the named inventors. That application is incorporated herein by reference in its entirety.

BACKGROUND OF THE INVENTION

1. Field of the Invention

This invention relates to the addition of fluorinated amphoteric surfactants to aqueous basic solutions to yield developers for alkali developable photoresists. The addition of the surfactant lowers the surface tension of the developer for improved wetting without detrimental effects on resist photospeed, profile, depth of focus and resolution.

2. Background Art

A common method of developing photoresists consists of applying a small volume of developer to a resist film which is oriented parallel to the ground. The developer may be applied in a stream or by spraying. The developer forms a pool (puddle) on top of the resist and is allowed to remain until the end of the development cycle. The developer is then removed typically by a combination of spinning and aqueous rinsing.

U.S. Pat. No. 3,891,439, issued Jun. 24, 1975, is directed to a developer composition for lithographic printing plates which comprises an aqueous solution comprised of from about 5% by weight to 30% by weight of an amphoteric 2-alkyl substituted imidazoline surfactant and from 5% by weight to 25% by weight of a water-soluble organic lithium salt.

U.S. Pat. No. 4,464,461, issued Aug. 7, 1984, is directed to a developing composition for use in developing an image-wise exposed layer of a light sensitive quinone diazide composition, the composition comprises a quaternary alkynol ammonium hydroxide developing agent in a stabilizing concentration of a semicarbazide.

U.S. Pat. No. 4,610,953, issued Sept. 9, 1986, is directed to an aqueous developer solution for a positive-type photoresist which comprises 0.5% to 3% by weight, based on the developer solution of tetramethyl-ammonium hydroxide, 1% to 4% by weight based on the developer solution of trimethylhydroxyethyl ammonium hydroxide and water as a solvent for the two components.

U.S. Pat. No. 4,613,561, issued Sept. 23, 1986, is directed to a developer for a positive photoresist which comprises a formulation of an aqueous alkali-base such as potassium hydroxide, in a fluorocarbon or carboxylated surfactant.

U.S. Pat. No. 4,628,023, issued Dec. 9, 1986, describes an aqueous metal ion-free developer composition for developing photoresist which comprises a metal ion-free alkali in a metal ion-free surfactant that is a quaternary ammonium compound.

U.S. Pat. No. 4,661,436, issued Apr. 28, 1987, describes a positive photoresist metal ion aqueous developer which comprises a formulation of an aqueous alkali base such as potassium hydroxide and a fluorocarbon surfactant.

U.S. Pat. No. 4,710,449, issued Dec. 1, 1987, describes a developer which contains an organic base and a particular fluorocarbon surfactant.

U.S. Pat. No. 4,741,989, issued May 3, 1988, describes a developer for positive photoresist which comprises an aqueous solution of a particular quaternary ammonium hydroxide in at least one development modifier selected from the group consisting of water-soluble aliphatic ketones, cyclic ethers, and tertiary amines.

U.S. Pat. No. 4,784,937, issued Nov. 15, 1988, describes a developing solution for positive-working photoresist composition which comprises an aqueous medium, an organic basic compound free from metal ions in an amount sufficient to obtain a pH between 11.0 and 13.5 and a fluorine-containing surface active agent.

U.S. Pat. No. 4,806,453, issued Feb. 21, 1989, describes an aqueous alkali developer for development of an exposed bottom resist layer of a bilayer photoresist film. The developer is an aqueous alkaline solution of a tetra alkyl ammonium hydroxide having at least two alkyl groups with two or more carbon atoms and is preferably tetra ethyl ammonium hydroxide.

U.S. Pat. No. 4,820,621, issued Apr. 11, 1989, describes an aqueous developer solution for a positive-working photoresist composition comprising a water-soluble organic base compound in a specific nonionic surface-active agent which may be an alkyl substituted phenyl or naphthyl ether of polyoxyethylene glycol in a specified concentration.

U.S. Pat. No. 4,914,006, issued April 3, 1990, describes a positive resist developer comprising a solution containing a quaternary ammonium hydroxide, a cationic surfactant, and a nonionic surfactant.

Japanese Publication No. 55-66909 describes a developing solution for positive type photoresists. The developing solution consists of tetramethyl ammonium hydroxide to which is added a novolak-type phenol resin.

Substrate size in the semiconductor industry has increased over the years. A consequence of this increase in size is an increase in the difficulty in wetting all parts of the resist quickly and evenly in less than one second. Failure to maintain even wetting can lead to uneven development, poor reproducibility and subsequent poor device performance. Surfactants can lower the surface tension and improve wetting of the photoresist by the developer leading to even development. However, most surfactants degrade photoresist profiles and/or resolution and/or depth of focus and/or photospeed.

BRIEF SUMMARY OF THE INVENTION

In the present invention, it has been found that the addition of fluorinated amphoteric surfactants to an aqueous basic solution yields developers for alkali developable photoresists which decreases the surface tension of the developer for improved wetting without detrimental effects on resist photospeed and profile.

Specifically, the developer of this invention comprises at least one water-soluble base which is selected from an alkali metal hydroxide such as sodium or potassium hydroxide, a silicate, a carbonate, or a quaternary ammonium hydroxide represented by the following formula:

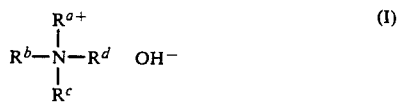

wherein $R^a$ to $R^c$ are respectively alkyl groups each having 1 to 4 carbon atoms, preferably 1 or 2 carbon atoms, and $R^d$ is an alkyl group having 1 to 4 carbon atoms, preferably 1 or 2 carbon atoms or a hydroxyalkyl group having 1 to 3 carbon atoms. Among the quaternary ammonium hydroxides of formula (I), the most preferred are the hydroxide in which $R^a$ to $R^d$ are each methyl, (tetramethylammonium hydroxide) and the hydroxide in which $R^a$ to $R^c$ each methyl and $R^d$ is hydroxyethyl (choline).

The other component of the developer comprises at least one fluorinated amphoteric surfactant of the following general formula:

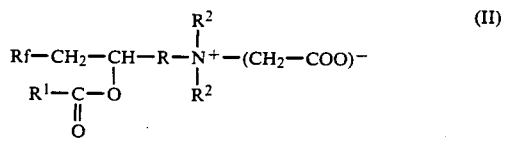

wherein Rf is $F(CF_2\text{-}CF_2)_{3\text{-}8}$;

R is $(CH_2)_x$ wherein x is an integer of 1 to 4;

$R^1$ is lower alkyl of 1 to 6 carbon atoms, aryl or substituted aryl; and $R^2$ is lower alkyl of 1 to 6 carbon atoms.

DETAILED DESCRIPTION

A preferred surfactant has the following formula:

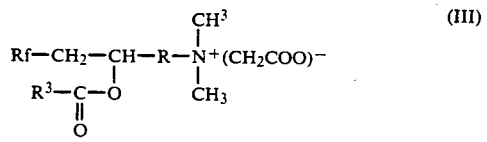

wherein R and Rf are as defined above and $R^3$ is lower alkyl of 1 to 6 carbon atoms;

The most preferred surfactant has the following formula:

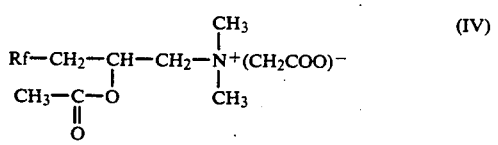

wherein Rf is as defined above.

The amount of water-soluble base used in these developer comPositions may be any amount commonly used in conventional developer compositions. Preferably, the amount of such water-soluble organic base is from about to about 5% by weight of the developer composition. More preferably, the amount of this base is from about 1% to about 5% by weight of the developer composition.

The fluorinated amphoteric surfactant is used in amounts of from 0.001 to about 1.0, preferably from about 0.02 to about 0.1 weight percent of the developer composition.

The developing process of the positive photoresist is performed in accordance with known methods except that the developer of this invention is used.

For example, a positive resist can be applied to a substrate by any conventional method used in the photoresist art, including dipping, spraying, whirling, and spin coating. When spin coating, for example, the resist mixture can be adjusted as to the percentage of solids content in order to provide a coating of the desired thickness given the type of spinning equipment and spin speed utilized and the amount of time allowed for the spinning process. Suitable substrates include silicon, aluminum or polymeric resins, silicon dioxide, doped silicon dioxide, silicon resins, gallium arsenide, silicon nitride, tantalum, copper, polysilicone, ceramics, and aluminum/copper mixtures.

The photoresist coatings may be applied to thermally grown silicon/silicon dioxide-coated wafers such as are utilized in the production of microprocessors and other miniaturized integrated circuit components. An aluminum/aluminum oxide wafer can be used as well. The substrate may also comprise various polymeric resins especially transparent polymers such as polyesters and polyolefins.

After the resist solution is coated onto the substrate, the coated substrate is baked at approximately 70° C. to 125° C. until substantially all the solvent has evaporated and only a uniform light-sensitive coating remains on the substrate.

The coated substrate can then be exposed to radiation, especially ultraviolet radiation, in any desired exposure pattern, produced by use of suitable masks, negatives, stencils, templates, and the like. Conventional imaging process or apparatus currently used in processing photoresist-coated substrates may be employed with the present invention. In some instances, a post-exposure bake at a temperature about 10° C. higher than the soft bake temperature is used to enhance image quality and resolution.

The exposed resist-coated substrates are next developed in an aqueous alkaline developing solution of this invention. Conventional development techniques such as immersion development, spray development or puddle development, or combinations thereof, may be used for this step.

The substrates are allowed to remain in the developer until all of the resist coating has dissolved from the exposed areas. Normally, development times of from about 10 seconds to about 3 minutes are employed.

After selective dissolution of the coated wafers in the developing solution, they are preferably subjected to a deionized water rinse to fully remove the developer or any remaining undesired portions of the coating and to stop further developments. This rinsing operation (which is part of the development process) may be followed by blow drying with filtered air to remove excess water. A post-development heat treatment or bake maY then be employed to increase the coating's adhesion and chemical resistance to etching solutions and other substances. The post-development heat treatment can comprise the baking of the coating and substrate below the coating's thermal deformation temperature.

In industrial applications, particularly in the manufacture of microcircuitry units on silicon/silicon dioxide-type substrates, the developed substrates may than be treated with a buffered, hydrofluoric acid etching solution or plasma gas etch. The resist compositions of the present invention are believed to be resistant to a wide variety of acid etching solutions or plasma gases and provide effective protection for the resist-coated areas of the substrate.

Later, the remaining areas of the photoresist coating may be removed from the etched substrate surface by conventional photoresist stripping operations.

EXAMPLES

The following examples illustrate this invention and are presented without the intention of being limited thereby.

Resist films were prepared by spin coating 5 ml of OIR 3512 photoresist (a conventional diazonaphthoquinone/novolak resist from OCG Microelectronic Materials, Inc.). On a silicon wafer and softbaking at 85° C. for 60 seconds to give a 1.185 micron thick film. The resist films were then exposed to 365 nm light using a 0.45 NA GCA stepper. The exposed resists were then post-exposure baked at 110° for 60 seconds. Images were obtained by spray/puddle development for 60 seconds using Developer A, B, or C. The developed images were then rinsed and spun dry. Developer A was 0.262N tetramethyl ammonium hydroxide. Developer B was Developer A plus 600 ppm by weight Surfynol 440 nonionic surfactant. Developer C was developer A plus 600 ppm by weight Zonyl FSK, a fluorinated amphoteric surfactant $(RfCH_2(OCOCH_3)CH_2N^+(CH_2CHCO_2^-)-)$. The developed patterns were examined by SEM photograph. Developer B showed degraded resolution and profiles relative to Developer A and C. Developer C showed the same resolution and equal or better profiles as developed.

The surface tension of the solution of Developer C was lowered from >60 dynes/cm$^2$ to about 34 dynes/cm$^2$.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. An aqueous developer composition for alkali developable photoresists which comprises (a) at least one water-soluble base and (b) and at least one fluorinated amphoteric surfactant of the following formula (II):

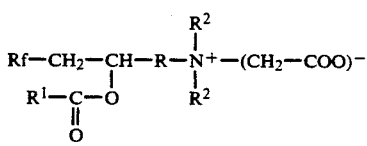

wherein

Rf is F $(CF_2\text{-}CF_2)_{3\text{-}8}$;
R is $(CH_2)_x$ wherein x is an integer of 1 to 4;
R$^1$ is lower alkyl of 1 to 6 carbon atoms, aryl or substituted aryl; and
R$^2$ is lower alkyl of 1 to 6 carbon atoms.

2. A developer as defined in calim 1 wherein said surfactant has formula (III):

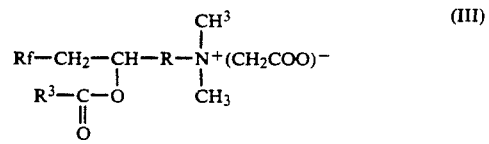

wherein 'Rf is F $(CF_2\text{-}CF_2)_{3\text{-}8}$;
R is $(CH_2)_x$ wherein x is an integer of 1 to 4; and
R$^3$ is lower alkyl of 1 to 6 carbon atoms.

3. A developer as defined in claim 1 wherein said surfactant has formula (IV):

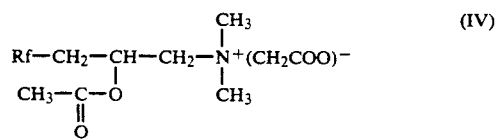

4. A developer as defined in claim 1 wherein said base is an alkali metal hydroxide.

5. A developer as defined in claim 1 wherein said alkali metal hydroxide is sodium or potassium hydroxide.

6. A developer as defined in claim 1 wherein said base is a silicate.

7. A developer as defined in claim 1 wherein said base is a carbonate.

8. A developer as defined in claim 1 wherein said base is a quaternary ammonium hydroxide represented by formula (I):

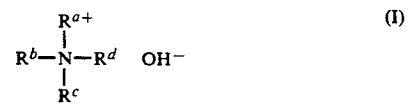

wherein R$^a$, R$^b$, and R$^c$ are respectively alkyl groups each having 1 to 4 carbon atoms, and R$^d$ is an alkyl group having 1 to 4 carbon atoms or a hydroxyalkyl group having 1 to 3 carbon atoms.

9. A developer as defined in claim 8 wherein R$^a$ R$^b$, R$^c$, and R$^d$ are each methyl.

10. A developer as defined in claim 8 wherein R$^a$, R$^b$, and R$^c$, are each methyl and R$^d$ is hydroxyethyl.

11. A developer as defined in claim 8 wherein said fluorinated amphoteric surfactant is used in amounts of from 0.001 to about 1.0 weight percent of said developer composition.

12. A developer as defined in claim 8 wherein said base is used in amounts of from about 0.5% to about 5% by weight of said composition.

* * * * *